United States Patent [19]

Blankenship

[11] 4,314,837
[45] Feb. 9, 1982

[54] REACTANT DELIVERY SYSTEM METHOD

[75] Inventor: Michael G. Blankenship, Corning, N.Y.

[73] Assignee: Corning Glass Works, Corning, N.Y.

[21] Appl. No.: 16,446

[22] Filed: Mar. 1, 1979

[51] Int. Cl.³ .............................................. C03C 25/02
[52] U.S. Cl. .................................... 65/3.12; 65/13; 73/204; 137/90; 261/39 E
[58] Field of Search ................... 65/3 A, 13, DIG. 7; 48/191; 137/90; 261/39 E; 73/204

[56] References Cited

U.S. PATENT DOCUMENTS

| | | | |
|---|---|---|---|
| 3,771,260 | 11/1973 | Arenson | 48/190 |
| 3,826,560 | 7/1974 | Schultz | 65/3 A X |
| 3,859,073 | 1/1975 | Schultz | 65/3 A X |
| 3,938,384 | 2/1976 | Blair | 73/204 |
| 3,939,858 | 2/1976 | LeMay | 137/90 |
| 4,111,219 | 9/1978 | Hallberg et al. | 137/3 |
| 4,220,460 | 9/1980 | Portus | 48/39 E X |

Primary Examiner—Robert L. Lindsay, Jr.
Attorney, Agent, or Firm—William J. Simmons, Jr.

[57] ABSTRACT

A method for delivering vaporous source materials to an oxidizing reaction flame or the like. Each constituent is maintained in liquified form in an enclosed container that is provided with a heater for raising the temperature of the liquid to a value sufficient to provide a predetermined vapor pressure within the reservoir. The resultant vapors are transferred by means of individually controlled metering means and appropriate conduits to the reaction device. Oxygen may be added to the vapor conveying conduit or directly to the vapor utilization device.

3 Claims, 2 Drawing Figures

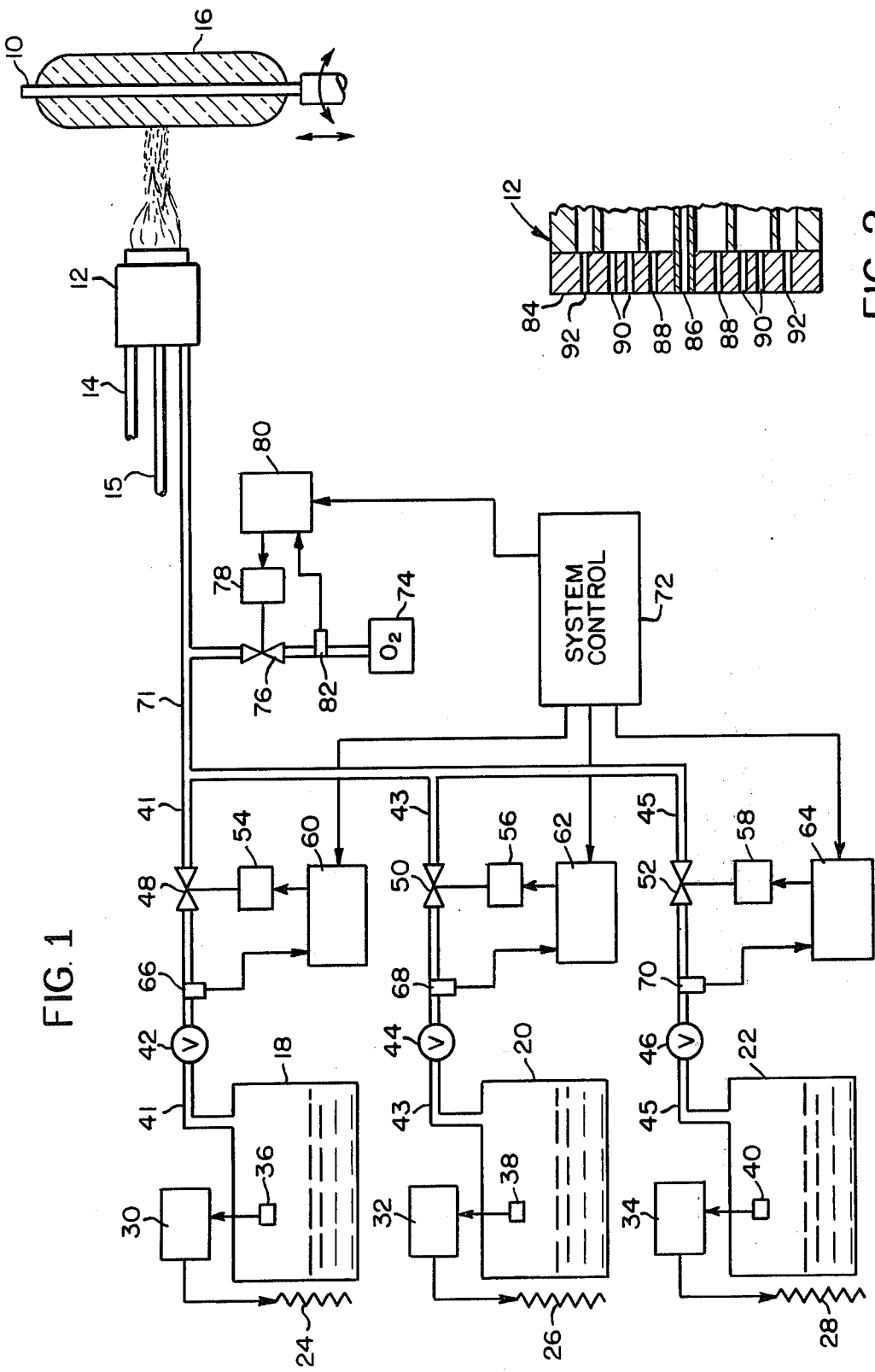

REACTANT DELIVERY SYSTEM METHOD

BACKGROUND OF THE INVENTION

The present invention relates to glass producing apparatus, and more particularly to improved means for supplying vaporized source material to an apparatus for forming blanks to be drawn into optical waveguides.

Light can be caused to propagate within an elongate transparent body (such as a filament of glass or the like) in discrete modes if certain preconditions are met. The size of the filament, the radial gradation in refractive index, and other considerations combine to determine the effectiveness of the filament as a transmitting medium for optical communications. In order to transmit the light without excessive dispersion among propagation modes, or to allow only predetermined modes of light to propagate, the internal characteristics of the strand must be closely controlled.

It is well known that a filament suitable for use as an optical waveguide can be formed by heating a cylindrical blank of a transparent dielectric material, such as glass, and drawing the blank into the desired thin, elongate structure. The structural characteristics of the waveguide closely reflect those of the blank from which it is drawn, particularly the gradient of the refractive index.

According to one popular practice a drawing blank is formed by coating a rotating, cylindrical starting member with successive layers of a sinterable glass soot. The soot is built up, layer by layer, from minute siliceous particles which are applied to the surface of the blank through the mechanism of an oxidizing reaction flame or the like. As will be recognized by those skilled in the art, the flame used for sintering and transferring particles to the surface of a glass blank or the like has in the past been termed a "hydrolyzing flame". Although the precise phenomenon involved is not yet fully understood, recent studies suggest that the actual reaction is more properly characterized as oxidation. Accordingly, the description of this reaction with respect to a presently preferred embodiment will use the term "oxidizing", it being recognized that the precise nature of the chemical reaction involved is not a material factor in practicing the present invention. A siliceous matrix material, such as silicon tetrachloride, is supplied in the form of a vapor to a burner from which the flame issues. Other materials, herein termed dopants, are also supplied in controlled amounts and at particular times to vary the optical characteristics of the end product. It should be understood that whereas the preferred embodiment is described in conjunction with the formation of silicate glasses, silica-free glasses containing germania, for example, may be formed by the apparatus of this invention.

The various vaporized or nebulized materials then combine with oxygen in the burner flame to form tiny spherical particles, which are maintained in the molten state and propelled toward the surface of the blank by the force of the flame. In this manner the deposited material, commonly termed "soot", is laid down along a spiral locus, layer by layer, the various layers merging together to form a continuum.

In another well known process the vaporous source material is directed into a heated tube. The material is deposited within the tube in successive layers and the tube is then collapsed to leave a fused blank. The blank is subsequently heated and drawn into an elongate filament.

In order to form a blank having generally consistent properties, and to assure an even distribution of the glassforming soot, it has been necessary to supply a hydrolyzing burner with a substantially constant flow of vaporized source material entrained in a carrier gas. Accordingly, systems have been devised for controlling the carrier gas flow, and the rate at which source material is vaporized and entrained into the carrier gas. Due in part to the multiplicity of factors which determine the amount of vapor introduced into a hydrolyzing flame at any given time, fluctuations in the deposited rate of the various vapor deposition processes often occur.

An improved system that employs a carrier gas to deliver a reactant vapor is disclosed in copending application Ser. No. 872,619 filed in the name of M. Aslami on Jan. 26, 1978 and assigned to the assignee of the present application. That system comprises a column having a packing therein and a pump for circulating liquid source material through the packing. Pressurized carrier gas is introduced into the packing and flows therethrough, the source material vapor becoming entrained in the carrier gas. The gas leaves the column through an exhaust port and is conducted to the site at which it is to be deposited. Although the vapor flow rate can be accurately controlled by the system of the Aslami application, the pressure and temperature within the liquid source material reservoir must be precisely controlled. Accordingly, it will be appreciated that it would be highly desirable to provide a system for delivering vaporized source material to a hydrolyzing burner in a consistent, highly controllable fashion without having to precisely control the temperature and pressure in the source material reservoir.

My copending application Ser. No. 885,215 filed Mar. 10, 1978 and assigned to the assignee of the present application discloses an apparatus which supplies a precisely controlled amount of reactant vapors to discharge means. In accordance with the teachings of that application, various reaction product constituents are maintained in liquid form in reservoirs, and a metering pump is coupled to each reservoir for delivering a predetermined volume of the liquid constituent to a mixing stage. The various liquids are thoroughly mixed, then nebulized. The material vapors are transported to discharge means such as a reaction burner or the like. The source material vapors are then reacted in the flame in a conventional manner, and deposited upon a substrate to form a product such as an optical waveguide blank. Although the apparatus of my copending application is capable of precisely controlling the amount of the various reaction product constituents delivered to the utilization means, the variable output pumps utilized in that system are very expensive.

From the foregoing, it should now be understood that it would be highly desirable to provide a system for delivering waveguide materials to a reaction burner or the like which obviates the above disadvantages, and provides a controllable flow of highly densified vapors of the desired materials.

It is therefore an object of the present invention to provide improved apparatus for supplying vaporized source material to a utilization means.

A further object of the invention is to provide a system for delivering waveguide constituents from their respective reservoirs without the need for a carrier gas.

Another object is to furnish simplified apparatus for metering waveguide component materials.

Yet another object is to provide an apparatus capable of delivering increased amount of reactant vapors to a vapor deposition means.

SUMMARY OF THE INVENTION

Briefly stated, in accordance with one aspect of the invention, the foregoing objects are achieved by providing an improved system including discharge means for depositing a reaction product upon a substrate. The system comprises first and second enclosed reservoirs, each for containing a liquid comprising a desired reaction product constituent. Means associated with each of the reservoirs heats the liquid therein to a temperature sufficient to maintain a predetermined minimum vapor pressure within each reservoir. Metering means is coupled to each reservoir for delivering vapors of the liquid disposed therein at a controlled flow rate. The vapors received from the metering means are combined prior to being conveyed to the discharge means.

BRIEF DESCRIPTION OF THE DRAWING

FIG. 1 depicts a system constructed in accordance with the present invention.

FIG. 2 is a fragmentary cross-sectional view of a burner which may be employed in conjunction with the system of FIG. 1.

DESCRIPTION OF THE PREFERRED EMBODIMENT

Referring to FIG. 1, a layer of glass soot is applied to a substantially cylindrical mandrel or starting member 10 by discharge means such as a flame hydrolysis burner 12. The starting member is rotated and translated with respect to the burner so as to build up a generally cylindrical preform 16. For purposes of explanation, the present illustration is described in connection with the formation of a blank susceptible of being drawn into an optical waveguide, although the invention is not necessarily limited to such applications. As is familiar to those skilled in the art, the substrate or starting member 10 can subsequently be removed by mechanical or chemical processes so as to leave only the deposited material. The cylindrical blank is subsequently drawn into an elongate waveguide whose characteristics deflect the composition of the reaction product constituents. Further, techniques other than flame reaction may be chosen for depositing the desired reaction products. For example, the reaction of vapors may take place within a heated region of a substrate tube, deposition of glass occurring on the inner surface of the tube, a process sometimes referred to as inside vapor phase oxidation (IVPO).

The constituents which are ultimately incorporated in the reaction products are maintained in reservoirs 18, 20 and 22 which may be commercially-available pressurized tanks. These reservoirs are provided with heaters 24, 26 and 28 for maintaining the temperature of the reactants sufficiently high to maintain the vapor pressure within the reservoirs at a level sufficient to cause adequate vapor flow through the metering apparatus to the burner. The minimum vapor pressure for accomplishing this purpose is 4 psig. The maximum pressure in the reservoirs is dictated by equipment limitations such as the mass flow controller described hereinbelow, the recommended maximum operating pressure of which is 150 psig. Temperature controllers 30, 32 and 34, which maintain the source material in each reservoir at an appropriate temperature, may be selected from such commercially available units as model 383 Robert Shaw controllers, Eurotherm controllers, or the like. Pressure sensors 36, 38 and 40 provide controllers 30, 32 and 34, respectively, with controls signals. Accordingly, the reservoir pressure is monitored, and the information thus derived is used to control the operation of heaters 24, 26 and 28. Appropriate valves 42, 44 and 46 in lines 41, 43 and 45, respectively, are associated with the respective reservoirs for exercising some control over vapor flow if desired, and allowing the flow of various vapors to be completely cut off as, for example, for system maintenance or reservoir replacement. Pressure control valves 48, 50 and 52 are provided in lines 41, 43 and 45, respectively, so that the rates of flow of the respective vapors from the reservoirs may be controlled. In order to more easily operate the system, it is anticipated that valves 48, 50 and 52 are of a type which are controlled electromagnetically or by means of a motor. Accordingly, motors 54, 56 and 58 are illustrated as being coupled to the valves and operated by controllers 60, 62 and 64 to cause the flow of vapors from the reservoirs to vary in a desired manner. Mass flow rate transducers 66, 68 and 70 are disposed in flow sensing relationship with lines 41, 43 and 45, respectively. The signals provided by these transducers are applied to the controllers so that the mass flow rates of the vapors can be controlled. Each combination of a pressure control valve, motor, controller and transducer, for example those elements represented by numerals 48, 54, 60 and 66, is referred to as a mass flow controller. Such controllers are conventionally found in fluid flow systems, and various appropriate types of controllers are readily commercially available. One example of such a controller is the Tylon model FC-260, available from the Tylon Corp. of Torrance, Calif. In this system the motor 54, for example, comprises an electric heater coupled to a differential expansive tube with an attached ball which moves relative to the valve seat to vary the ball-to-seat opening, thus regulating gas flow through the valve. Each of the controllers 60, 62 and 64 has a setpoint input terminal which is connected to the system control unit 72 which may comprise a microprocessor or computer which is programmed to provide each controller with an appropriate control signal. Controller 72 may comprise an A-D converter with a model 3911A controller, a model 1500 CAMAC crate (Kinetic Systems, Inc.) coupled to a PDP 11/34 computer using a VT 52 video terminal, programmer console, DEC writer, RK 11T disk and a software, the last six components being obtainable from Digital Equipment Corporation.

The vapors flowing from lines 41, 43 and 45 are combined in line 71 which is connected to burner 12. Vapor delivery lines 41, 43, 45 and 71 must be heated to a temperature at least as high as the maximum temperature to which reservoirs 18, 20 and 22 are heated. Oxygen may also be introduced into line 71 from a source 74. The rate of oxygen flow is controlled by a mass flow controller comprising valve 76, motor 78, controller 80 and transducer 82. The flow rate of the oxygen is preferably controlled as a function of the flow rate of the vapor constituents so that an appropriate amount of oxygen is introduced into the system. While it is deemed preferable to inject some oxygen into the reactant vapors, this step is not necessary, and in fact one of the advantages of the present system is that a much more dense flow of reaction product constituents can be achieved inasmuch as a carrier gas is not relied upon as the means of transporting the reactant vapors.

While oxygen is needed to form the various oxides which constitute the soot formed in the flame of burner 12, such oxygen may be provided at the burner. A fragmentary cross-sectional view of burner 12 is illustrated in FIG. 2. A centrally located orifice 86 in burner face 84 is surrounded by concentric rings of orifices 88, 90 and 92. The reactant vapors emanate from orifice 86 where they are subjected to heat from a flame produced by the fuel gas and oxygen emanating from orifices 90. A stream of oxygen, referred to as the inner shield, emanates from orifices 88; this stream prevents reaction of the reactant compounds at the burner face. Finally, a stream of oxygen referred to as the outer shield emanates from orifices 92. This burner design is somewhat similar to that disclosed in U.S. Pat. No. 3,698,936 issued to H. J. Moltzan, the Moltzan patent differing in that it teaches an annular slot for providing the inner shield and in that it lacks the outer shield orifices. All of the orifices of burner 12 can be supplied by manifolds similar to those taught in the Moltzan patent.

Referring again to FIG. 1, fuel gas and oxygen, which are supplied to burner 12 by line 14, issue from the burner and are ignited. Additional oxygen may be supplied by line 15. The reactant vapors supplied by line 71 react in the flame to form a glass soot which is directed toward preform 16. The chlorine or other material with which the matrix and dopant materials had previously been combined is separated from the materials, and combines with hydrogen from the hydrocarbon fuel to form hydrochloric acid. The specific nature of the reaction depends, of course, upon the constituents present and the specific application of the invention. Such reactions themselves form no part of the present invention, and it is anticipated that constituents other than those disclosed herein may be used without departing from the thesis of the invention. In addition, still other forms of deposition apparatus such as the aforementioned IVPO apparatus, or other mechanisms which transfer the matrix and dopant materials to a substrate, may be selected for use with the invention. In the present illustration, it will be recognized that in the absence of oxygen as a carrier gas, additional oxygen above and beyond the stoichiometric amount required for combustion of the fuel may be delivered to the burner 12, for example, in the manner described in conjunction with FIG. 2.

To employ the illustrated system in the formation of an optical waveguide comprising $SiO_2$, $GeO_2$ and $B_2O_3$, for example, reservoirs 18, 20 and 22 may contain $SiCl_4$, $GeCl_4$ and $BCl_3$, respectively. Of course, many other glass-forming reactants capable of being delivered in vapor form may be employed. Temperature controllers 30, 32 and 34 are adjusted so that the vapor pressure in the respective reservoirs is sufficiently high to permit the vapors to be delivered through the mass flow controllers to the burner or other utilization means. Although it is believed that a minimum pressure of 4 psig could be employed, a constructed embodiment was adjusted so that the pressure within the reservoirs is maintained at about 12 psig. To provide this pressure, the temperature of the $SiCl_4$, $GeCl_4$ and $BCl_3$ should be maintained at about 76° C., 105° C. and 30° C., respectively.

Valves 42, 44 and 46 are opened and system control 72 provides each of the mass flow controllers with appropriate set point signals so that valves 48, 50 and 52 pass the desired amount of vapor to burner 12. A properly-metered flow of oxygen is also introduced into the burner along with the reactant vapors. The vapors react with oxygen in the flame to form soot which is deposited upon the surface of soot preform 16. Mandrel 10 is removed from the completed preform which is then heated and consolidated into a monolithic glassy blank which can be drawn into an optical waveguide in the conventional manner.

In order to radially vary the index of refraction of the waveguide structure, the proportions of the various constituents are changed in a predetermined manner during the formation of the blank. Accordingly, system control 72 is caused to produce command signals for various ones of the mass flow controllers at predetermined times so that the amount or kind of dopants are changed. Ordinarily, the change is such as to effect a decrease in the refractive index of the ultimate glass product with increasing preform radius. Accordingly, flow control valves 48, 50 and 52 appropriately regulate the flow of reactant vapors therethrough.

The disclosed type of vapor delivery system is capable of delivering reactant vapors to a deposition apparatus with extremely high accuracy. Accurate control of the temperature and pressure of the liquids in the reservoirs is unnecessary; it is only necessary to maintain the pressure therein sufficiently high so that the vapors can be transported through the mass flow controllers to the burner.

It will now be understood that there has been disclosed an improved system for delivering vaporous source material to deposition means in a precisely controlled manner. As will be evident from the foregoing description, certain aspects of the invention are not limited to the particular details of the examples illustrated, and it is therefore contemplated that other modifications or applications will occur to those skilled in the art. For example, while an outside vapor deposition process is illustrated by the instant figures, it should be apparent to those skilled in the art that the illustrated system lends itself equally well to inside vapor deposition processes and to similar uses wherein the flow of vapor to the deposition means must be controlled within a narrow range. It is accordingly intended that the appended claims shall cover all such modifications and applications as do not depart from the true spirit and scope of the invention.

I claim:

1. A method for forming an optical fiber preform by depositing on a substrate by means of the oxidation a mixture of at least two reactants in vapor form, said method comprising the steps of providing a heated reaction zone adjacent said substrate surface, supplying first and second reactants in liquid form in first and second pressurized containers, respectively, heating each of said containers to a temperature sufficient to maintain within each said container a predetermined minimum vapor pressure, supplying vapors from said containers to said reaction zone, sensing the rate of flow of vapors from each of said containers, controlling the flow of vapors from each of said containers in response to the sensed flow rate of vapors therefrom, combining the vapors from said first and second containers, and mixing oxygen with said vapors after the flow of said vapors has been controlled, whereby a precisely metered amount of constituent vapors can be obtained from a container without passing oxygen through said container.

2. A method in accordance with claim 1 further comprising the steps of sensing the vapor pressure within said container and supplying an amount of heat to said container sufficient to maintain said predetermined minimum vapor pressure.

3. A method in accordance with claim 2 wherein the step of heating said container to a predetermined minimum vapor pressure comprises heating said container to a temperature sufficient to generate within said container a vapor pressure of at least four psig.

* * * * *